(12) United States Patent
Wang

(10) Patent No.: US 6,542,435 B1
(45) Date of Patent: Apr. 1, 2003

(54) METHOD AND APPARATUS FOR EQUALIZATION OF ADDRESS TRANSITION DETECTION PULSE WIDTH

(75) Inventor: Guowei Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/531,871

(22) Filed: Mar. 21, 2000

(51) Int. Cl.[7] .................................................. G11C 8/00
(52) U.S. Cl. .............................. 365/233.5; 365/230.01
(58) Field of Search ..................... 365/233.5, 230.01, 365/230.03, 194, 233, 185.11, 230.09, 238.05

(56) References Cited

U.S. PATENT DOCUMENTS 6,111,787 A * 8/2000 Akaogi et al. ......... 365/185.11
6,208,556 B1 * 3/2001 Akaogi et al. ......... 365/185.11
6,285,627 B1 * 9/2001 Kurihara .................. 365/233.5

* cited by examiner

Primary Examiner—Michael S. Lebentritt
Assistant Examiner—Anh Phung

(57) ABSTRACT

A method and apparatus ensure equal address transition detection (ATD) pulse width for all address and chip enable transitions. Address buffer signals from one end of an integrated circuit are combined to form a first combined signal. Address buffer signals and a chip enable signal from a second end of the integrated circuit are combined to form a second combined signal. The two combined signals are logically combined to form a first edge of an ATD pulse. A feedback signal controls the second edge of the ATD pulse for all input signal transitions.

18 Claims, 6 Drawing Sheets

* This ckt is used not only for CEB but also for feedback in atdbuf_nb ckt.
* ATDICE=ATDIFB for feedback in atdbuf_nb ckt.

METHOD AND APPARATUS FOR EQUALIZATION OF ADDRESS TRANSITION DETECTION PULSE WIDTH

BACKGROUND OF THE INVENTION

The present invention relates generally to memory integrated circuits. More particularly, the present invention relates to method and apparatus for equalizing the width of an address transition detection signal in a memory integrated circuit.

In many memory integrated circuits, it is known to use an address transition detection (ATD) circuit to generate an ATD signal. Such memories receive a multiple bit address signal as an input specifying a location for access of data stored in the memory. The address signal is typically received at a plurality of address buffers. Each address buffer provides signal translation and buffering and generation of true and complement signals for subsequent address decoding. In response to any transition of any bit of the input address signal, the ATD circuit generates the ATD signal. In addition to the address inputs, other signal inputs will cause generation of the ATD signal by the ATD circuit. These signal inputs include chip enable signals and write enable signals which control the operation of the memory integrated circuit.

It is conventional to generate an ATD signal that is a pulse of predetermined polarity and has predetermined time duration. For example, the ATD signal may normally have a logic 0 level until an address transition occurs. In response to the address transition, a pulse having a logic 1 level is generated by the ATD circuit. The pulse has a duration, such as 1 microsecond, which is controlled by timing elements of the ATD circuit. If subsequent address transitions occur during the pulse duration, the pulse timing is reset to ensure the full duration of the pulse.

The ATD signal provides a convenient timing reference. Many other internal signals are timed in response to the timing of the ATD signal. These other signals include decoding of the input address to select a unique storage location within the memory for storage or retrieval of data. These other signals include a word line supply voltage used for read access of a storage location. A change of an address signal produces a timing reference for subsequent operations in the memory integrated circuit.

However, different operations and the physical layout of the memory integrated circuit can alter the width or duration of the ATD pulse. Many memory integrated circuits are arranged with some address buffers at one end of the chip and other address buffers at the other end of the chip. Internal operations, such as automatic power-down functions, can change the operation of the ATD circuit and therefore the width of the ATD pulse.

It is desirable, however, for optimum and consistent operation of the memory integrated circuit, to have a uniform pulse width for the ATD signal. Accordingly, there is a need for an improved method and apparatus providing equalized pulse width of an address transition signal in a memory integrated circuit.

BRIEF SUMMARY OF THE INVENTION

By way of introduction only, the present invention provides an improved method and apparatus for providing equalized pulse width in an address transition detector (ATD) signal in a memory. By careful circuit and layout design, capacitive loading on intermediate ATD signals is reduced to sharpen the voltage transitions on these intermediate ATD signals. A feedback delay circuit is added to the ATD signal generating circuit to define the duration of the ATD pulse. This equalizes the ATD pulse duration, regardless of the source of the address transition signal.

The foregoing discussion of the preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

Figure 1:
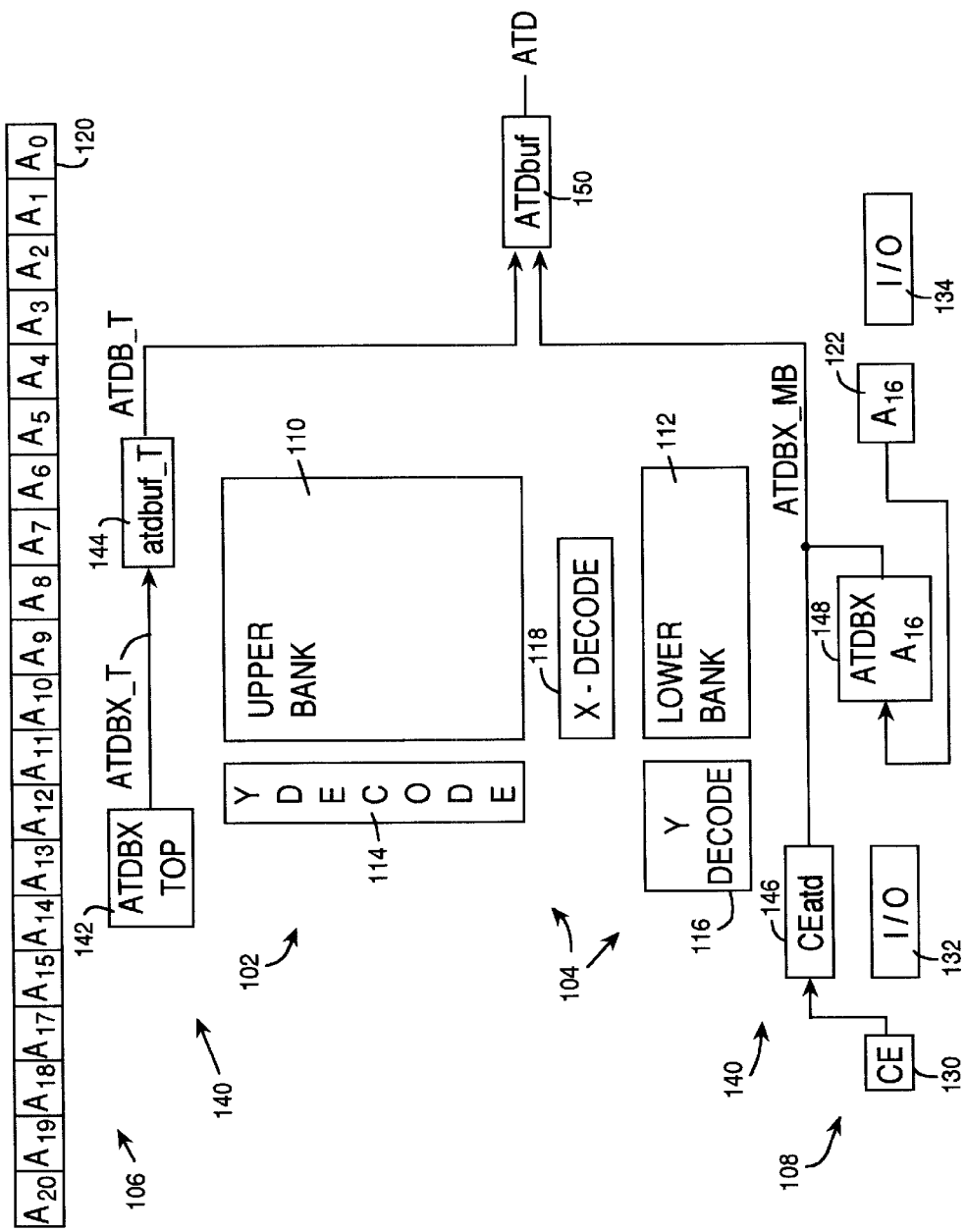
FIG. 1 is a block diagram of a memory integrated circuit.

Referring now to the drawings, FIG. 1 is a block diagram of a memory integrated circuit 100. The memory integrated circuit 100 includes a core cell array 102, address decoding circuitry 104, and peripheral circuitry along a first or top portion 106 and along a second or bottom portion 108. The memory integrated circuit 100 is preferably fabricated as a monolithic integrated circuit using conventional semiconductor processing techniques. Further, the illustrated embodiment of the memory integrated circuit 100 is configured as a non-volatile or flash memory which provides persistent storage of data even when operating power is removed from the memory integrated circuit 100. Such flash memories are well known in the art.

The core cell array 102 in the illustrated embodiment includes a first or upper bank 110 and a second or lower bank 112. Such a dual bank architecture provides numerous operational advantages. In particular, dual bank architecture permits reading of data from one bank while writing data to the other bank. Each bank 110, 112 includes a plurality of core cells which, in the flash memory embodiment of FIG. 1, include a single transistor memory cell having a floating gate for storing charge to provide data storage. Each bank is arranged as an ordered array of rows and columns of memory cells or core cells, with each memory cell located at an intersection of a row line or word line and a column line or bit line. For selecting an individual memory cell, appropriate voltages are provided to the word line and the bit line to either write or read data in the memory cell.

For selecting one or more memory cells, the address decoding circuit 104 includes a first Y decoder circuit 114, a second Y decoder circuit 116 and a global X decoder circuit 118. The first Y decoder circuit 114 is associated with the upper bank 110. Similarly, the second Y decoder circuit 116 is associated with the lower bank 112. The global X decoder circuit 118 is positioned between the upper bank 110 and the lower bank 112 for providing appropriate X or row decode voltages to each of the upper bank 110 and the lower bank 112. One or more memory cells in the banks 110, 112 are selected by driving a word line or row line of the bank 110, 112 to an appropriate high voltage level by the X decoder 118. The selected column is activated for writing or reading data by applying appropriate voltages to the column line or bit line by means of the first Y decoder 114 or second Y decoder 116. Structure and operation of dual bank, simultaneous operation memories are known in the art.

The address signals which identify the unique storage locations in the core cell array 102 for reading and writing of data are received at a plurality of address buffers 120. In the embodiment of FIG. 1, a 21-bit address signal is received at the memory integrated circuit 100 to define the storage locations selected for reading and writing. Thus, the address signal is defined by bits A20–A0. In the embodiment of FIG. 1, the address buffers 120 for receiving address bits A0–A15 and A17–A20 are located on the first or top portion 106 of the memory integrated circuit 100. The address buffers 120 thus receive one or more first input signals. Similar input buffers are used for receiving other input signals, such as data and control signals.

The address buffer 122 for receiving address bit A16 of the address signal is located on the bottom or second portion 108 of the memory integrated circuit 100. This positioning is a matter of design choice only, and alternative embodiments, the address buffers 120, 122 may be located at any suitable location on the memory integrated circuit 100. However, conventionally, input/output circuits such as address buffers 120, 122 are located along the peripheral edge of the integrated circuit 100 to facilitate connection of these circuits to external circuitry. Positioning of the address buffers 120, 122 is controlled in large part by mechanical and electrical connection requirements for the memory integrated circuit 100. Preferably, each of the address buffers 120, 122 is substantially identical. Each of the address buffers receives a single binary input address signal from off-chip and generates binary signals corresponding to the true and complement values of the input address signal. These true and complement address signals are used for decoding the input address signal by the address decoding circuit 104 to select the one or more unique storage locations in the core cell array 102 for reading and writing of data.

The bottom portion 108 of the memory integrated circuit 100 further includes a chip enable buffer 130 and other input/output circuits 132, 134. The chip enable buffer 130 receives a 1-bit chip enable signal which controls the output and overall operation of the memory integrated circuit 100. The other input/output buffers 132, 134 receive external signal or provide signals from the memory 100 to circuits external to the memory 100, as is known in the art. Such other input/output signals include data for reading and writing and control signals. The address buffer 122 and the chip enable buffer 130 thus receive one or more second input signals.

The memory 100 further includes address transition detection circuitry 140. The address transition detection (ATD) circuitry 140 generates an ATD signal. In response to any transition of any bit of the input address signal received at the address buffers 120, 122, the ATD circuitry 140 generates the ATD signal on a node labeled ATD. The ATD signal is a pulse of predetermined polarity and having a predetermined time duration. For example, the ATD signal may normally have a logic 0 level until an address transition occurs. In response to the address transition, a pulse having a logic 1 level is generated by the ATD circuit. The pulse has a duration, such as a 1 microsecond. The ATD signal is used as a timing reference by other circuits in the memory integrated circuit 100. Transitions at other signals, such as the chip enable signal, may also cause the generation of the ATD signal.

The ATD circuitry 140 includes a local ATD generating circuit 142 and an address transition detection buffer 144 at the top or first portion 106 of the memory integrated circuit. The ATD circuitry 140 further includes a chip enable ATD generating circuit 146, an ATD generating circuit 148, and an ATD buffer 150. Structure and operation of the ATD circuitry 140 will be described in further detail below in conjunction with FIGS. 2–5.

Thus, the address buffers 120, 122 are positioned at ends of the memory integrated circuit 100. The ATD circuitry 140 is located at ends of the memory integrated circuit and in the middle of the memory integrated circuit. Intermediate ATD signals generated by local ATD generated circuits 142, 146 must be conveyed substantial distances by the ATD circuitry 140. The memory integrated circuit 100 may be 10 mm or more in length or width. Signal lines extending across such long distances experience substantial capacitive coupling to adjacent signal lines and circuitry.

Figure 2:
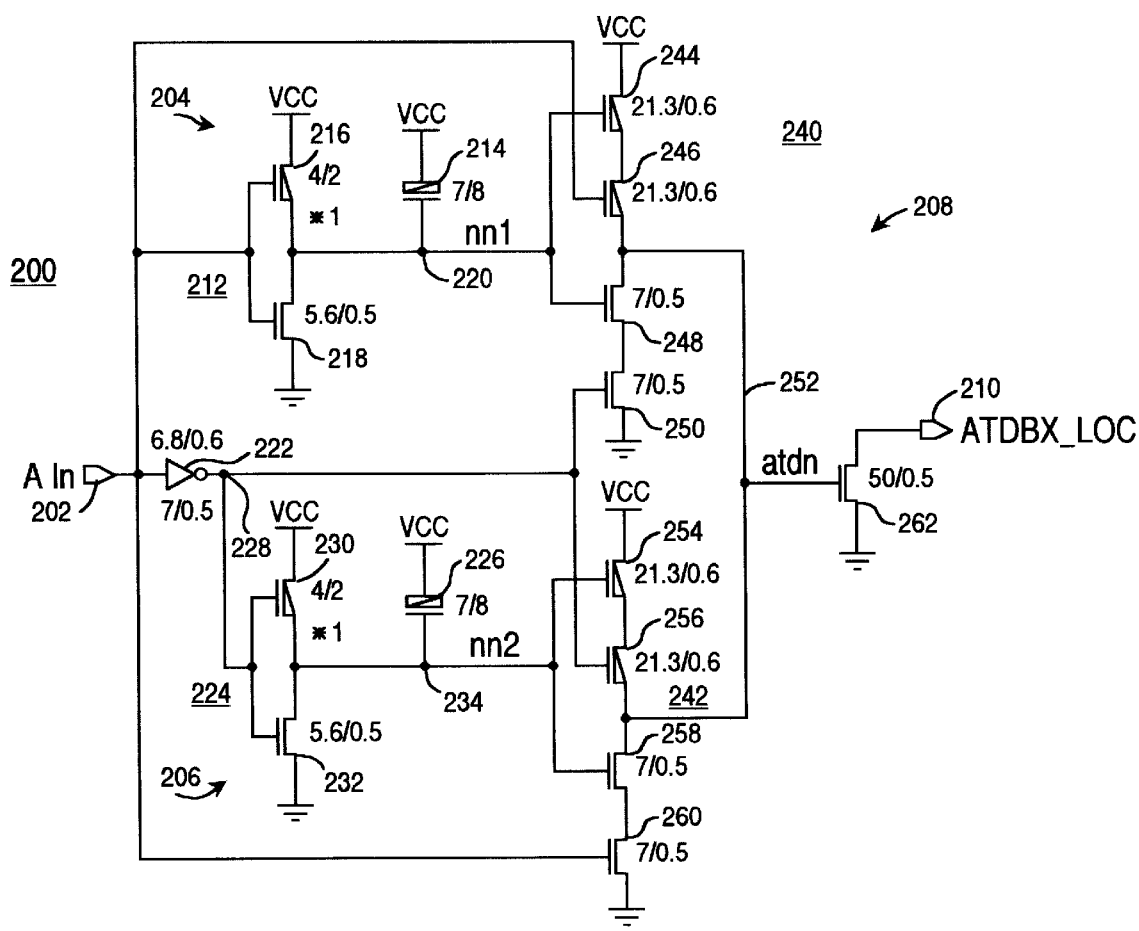
FIG. 2 is a schematic diagram of a first local address transition detection generating circuit for use in the memory integrated circuit of FIG. 1.

FIG. 2 is a schematic diagram of a local ATD generating circuit 200 for use in the memory integrated circuit 100 of FIG. 1. The local ATD generating circuit 200 of FIG. 2 corresponds to the ATD generating circuit 142, labeled ATDBX TOP and the ATD generating circuit 148 labeled ATDBX A16 in FIG. 1. In the illustrated embodiment, the local ATD generating circuit 200 is placed once for each address buffer A20–A0. When an input address changes, this circuit will generate a pulse and drive an intermediate ATD signal low. The circuit 200 includes an input 202, a first delay portion 204, a second delay portion 206, pulse generating logic 208 and an output 210.

The input 202 is labeled AIn in FIG. 2. For input address signals on the top portion 106 of the memory integrated circuit 100 of FIG. 1 AIn is equal to AI(20:17), AI(15:2). For address input signals on the bottom portion 108 of the memory integrated circuit, AIn equals AI16. When the input address signal changes from high to low, the input signal AIn also changes from high to low. These signals correspond to the input address signals at the address buffers.

The first delay circuit 204 includes an inverter 212 and a capacitor 214. The inverter 212 includes a first transistor 216 and a second transistor 218 configured as a conventional complementary metal-oxide-semiconductor (CMOS) inverter. Each of transistors 216, 218 has a gate connected to the input 202 and a drain connected to a node 220 labeled nn1 in FIG. 2. The source of transistor 216 is connected to the positive voltage supply VCC and the source of transistor 218 is connected to the negative voltage supply or ground. The capacitor 214 is formed using any conventional semiconductor processing technique, such as a MOS capacitor. The second delay circuit 206 includes an inverter 222, an inverter 224 and a capacitor 226. The inverter 222 is a conventional CMOS inverter having an input coupled to the input 202 and an output 228. The inverter 224 includes first transistor 230 and a second transistor 232. The transistors 230, 232 are configured as a conventional CMOS inverter. Each transistor 230, 232 has a gate coupled to the output 228 of the inverter 222 and a drain coupled to a node 234, labeled nn2 in FIG. 2. The capacitor 226 is coupled between the node 234 and VCC. The capacitor 226 may be made using any conventional technique.

The pulse generating logic 208 includes a first circuit 240 and a second circuit 242. The first circuit includes a p-channel transistor 244, a p-channel transistor 246, an n-channel transistor 248 and an n-channel transistor 250. The n-channel transistor 248 has a gate coupled to the node 220 and a drain coupled to a common node 252 and a source coupled to the n-channel transistor 250. N-channel transistor 250 has a drain coupled to the n-channel transistor 248, a gate coupled to the output 228 of the inverter 222 and a source coupled to ground. The p-channel transistor 246 has a drain coupled to the common node 252, a gate coupled to the input 202 and a source coupled to the drain of the p-channel transistor 244. The p-channel transistor 244 has a drain coupled to the source of the p-channel transistor 246, a gate coupled to the node 220 and a source coupled to the positive power supply VCC.

The second circuit 242 of the pulse generating circuit 208 includes a p-channel transistor 254, a p-channel transistor 256, an n-channel transistor 258 and an n-channel transistor 260. The p-channel transistor 256 has a drain coupled to the common node 252, a gate coupled to the output 228 of the inverter 222, and a source coupled to the drain of the p-channel transistor 254. The p-channel transistor 254 has a drain coupled to the source of the p-channel transistor 256, a gate coupled to the node 234, and a source coupled to the positive power supply VCC. The n-channel transistor 256 has a drain coupled to the common node 252, a gate coupled to the node 234 and a source coupled to the drain of the n-channel transistor 260. The n-channel transistor 260 has a drain coupled to the source of the n-channel transistor 258, a gate coupled to the input 202 and a source coupled to ground.

Lastly, the circuit 200 includes an open-drain driver transistor 262. The transistor 262 has a drain coupled to the output 210, a gate coupled to the common node 252, labeled ATDN, and a source coupled to ground.

As noted, the circuit 200 is placed once for each address buffer 120, 122 corresponding to input address signals A20–A0. On the first or top portion 106 of the memory integrated circuit 106, the output 210 of each of the circuits 200 are directly wired together to form a first combined signal at a node labeled ATDBX_T in FIG. 1. On the bottom portion of the chip, the circuit 200 for the address buffer which receives the input address bit A16 has an output 210 coupled to a node labeled ATDBX_MB.

When the address signal at the input 202 changes from high to low, the transistor 246 turns on, pulling the common node 252 high. This turns on the driver transistor 262. The first delay portion 204 inverts the address signal in the inverter 212 and starts charging up the node 220. Because of the capacitor 214 coupled to the node 220, the charge up of this node will be relatively slow. Before the voltage on the node 220 reaches the trip point of the first circuit 240, the common node 252 keeps a logic high level, still turning on the driver transistor 262. After the voltage on the node 220 reaches the trip point, the node 252 will go low, pulled down by the transistor 248 which is turned on and the transistor 250 which is turned on by virtue of the inverter 222 inverting the input signal at the input 202. This turns off the driver transistor 262.

On the other side of the circuit 200, the second delay circuit 206 discharges the node 234 quickly after the input signal at the input 202 is changed from high to low. The second circuit 242 is in a high impedance state because the transistor 258 is turned off by virtue of low voltage on the node 234 and transistor 256 is turned off by virtue of the high voltage at the output of the inverter 222.

When the input address changes from low to high, the circuit 200 operates in a complementary fashion. In response to the positive-going input address signal at the input 202, the inverter 212 discharges the node 220 and turns off the circuit 240. On the lower delay portion 206, the input signal is inverted in the inverter 222.

The high-going signal at the input 202 is inverted to a low-going signal at the input to the inverter 224. This signal turns on the transistor 256 which in turn turns on the driver transistor 262. The inverter 224 starts charging up the node 234. This charge up is delayed by the capacitance associated with the capacitor 226. When the voltage on the node 234 exceeds the trip point of the circuit 242, the common node 252 will be pulled low by the transistors 258 and 260. This in turn turns off the driver transistor 262.

As noted above, the output 210 of the circuit 200 is wire ORed with outputs of other identical circuits. In the particular embodiment shown, the outputs of the circuits corresponding to address signals $A_0$–$A_{15}$ and $A_{17}$–$A_{20}$ are wire ORed together. A pull up device is provided, as will be described below in conjunction with FIGS. 4–5, so that the output is normally high. Only when the common node 252 is activated by being driven to a logic 1 level to turn on the driver transistor 262, pulling down the output 210, does the output 210 go low. Thus, the one or more input signals formed by the input address signals are combined to produce a first combined signal, ATDBX_T in the illustrated embodiment.

It is to be noted that, in the preferred embodiment, the signal path through the circuit 220 is substantially identical for both positive going and negative going input signals. Two signal paths differ only by the presence of the inverter 222. Otherwise, the device configuration and device sizes are substantially identical.

It is to be further noted that the device sizes illustrated in the drawing, including FIG. 2 are illustrative only. In other embodiments, using other process technologies, other device sizes, orientations, etc. will be preferably used.

Figure 3:
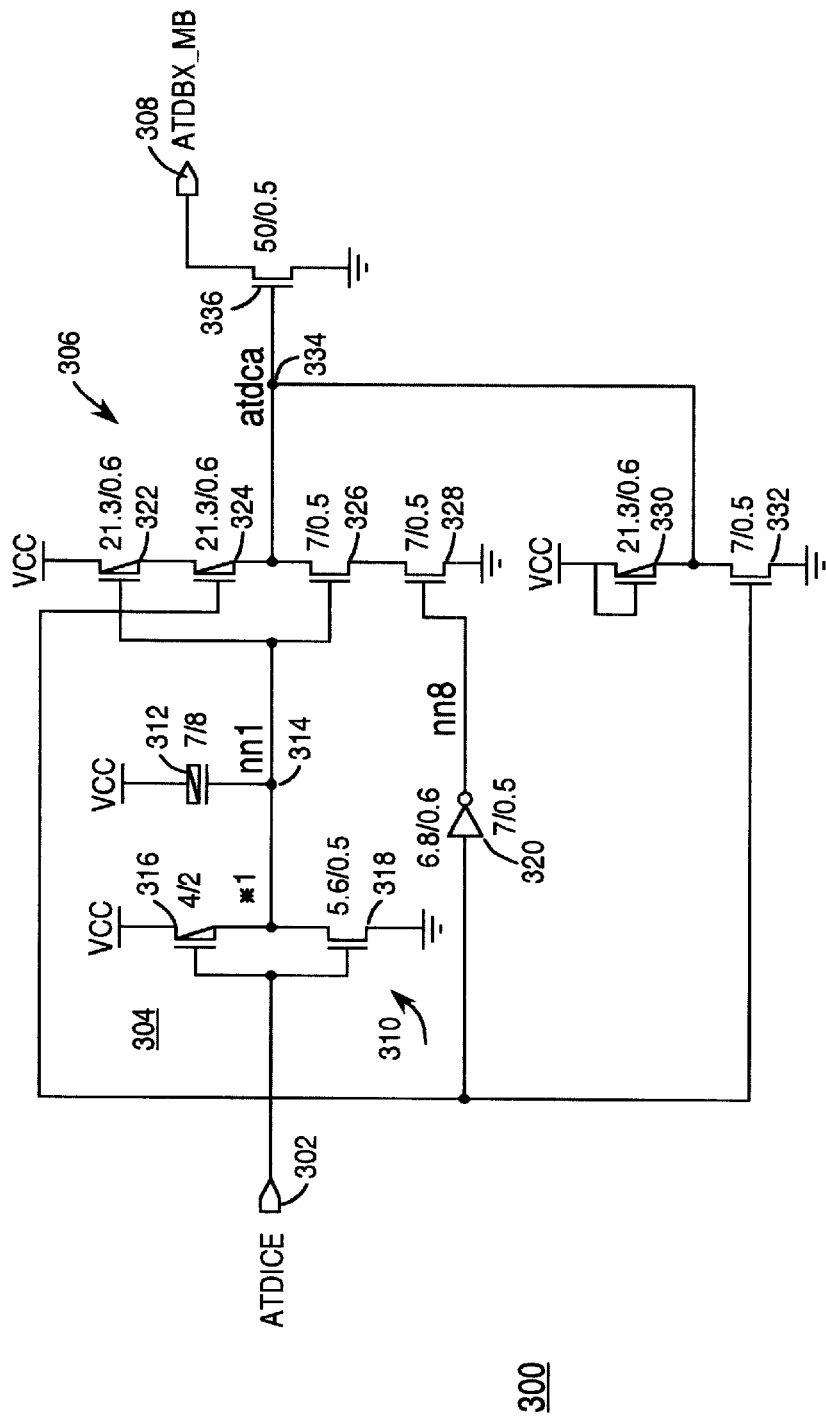
FIG. 3 is a schematic diagram of a second local address transition detection generating circuit for use in the memory integrated circuit of FIG. 1.

FIG. 3 is a schematic diagram of a local ATD generating circuit 300 for use in the memory integrated circuit 100 of FIG. 1. In particular, the circuit 300 may perform the function of the chip enable address transition detection circuit 146 of FIG. 1. The circuit 300 includes an input 302, a delay circuit 304, a pulse generating circuit 306 and an output 308.

The input 302 is coupled to the chip enable input buffer 130 (FIG. 1) for receiving a signal in response to the chip enable input signal of the memory integrated circuit 100. The chip enable signal is provided from external to the memory to control operation of the memory. In the illustrated embodiment, the chip enable signal is an active low signal, meaning that when the chip enable signal is driven from a logic high to a logic low level, the memory 100 is placed in an active mode and data may be written to or read from the memory 100. The delay circuit 304 includes an inverter 310 and a capacitor 312. The inverter 310 has an input coupled to the input 302 and an output coupled to a node 314. The inverter 310 is formed using a p-channel transistor 316 and an n-channel transistor 318, coupled in the conventional manner.

The pulse generating circuit 306 includes an inverter 320, a p-channel transistor 322, a p-channel transistor 324, an n-channel transistor 326 and an n-channel transistor 328. The pulse generating circuit 306 further includes a p-channel transistor 330, and an n-channel transistor 332. The pulse generating circuit controls the state of the signal applied at a node 334 to the gate of a driver transistor 336. The pulse generating circuit 306 is configured substantially like the first portion 240 of the pulse generating circuit 208.

When the chip enable signal received at the input 302 changes from high to low, the initial voltage change turns on the transistor 324, pulling the node 334 to a logic high level, turning on output transistor 336 and generating a pulse on the output 308. The input signal is inverted by the inverter 3 10, which begins charging up the node 314. This charge up process is delayed by the capacitance associated with the capacitor 312. When the voltage on the node 314 reaches the trip point of the pulse generating circuit 306, the node 334 will be pulled low by the transistors 326, 328. This will turn off the output transistor 336, allowing the output 308 to float. As is illustrated in FIG. 1, the output 308 is coupled to a node labeled ATDBX_MB. The other signal on this node is the address transition detection signal from the address input A16. Thus, when either the address signal A16 is active, transitioning between high and low logic levels, or when the chip enable signal is active, transitioning from high to low logic levels, a pulse will be generated on the node ATDBX_MB. In this way, the one or more second input signals (chip enable and $A_{16}$) are combined to produce a second combined signal, ATDBX_MB. A pull up circuit is included to bias the output 308 to a logic high level, as will be described below in connection with FIG. 5.

On the other transition of the chip enable signal, no pulse is generated. When the chip enable input signal transitions from low to high, the transistor 332 is turned on, pulling the node 334 low and turning off the output driver transistor 336. This insures that an ATD pulse is only generated on the active edge of the chip enable signal, changing from high to low.

In the preferred embodiment, the signal path through the chip enable ATD generating circuit 300 is substantially identical to the signal path through the address input ATD generating circuits illustrated in FIG. 2. Preferably, the device sizes are substantially identical and circuit layout is substantially identical to insure that circuit delays and performance are substantial and identical. Other device sizes, orientations and configurations may be used, however, in the interest of equalizing the pulse duration of the ATD signal, substantially equal circuit paths are maintained.

Figure 4:
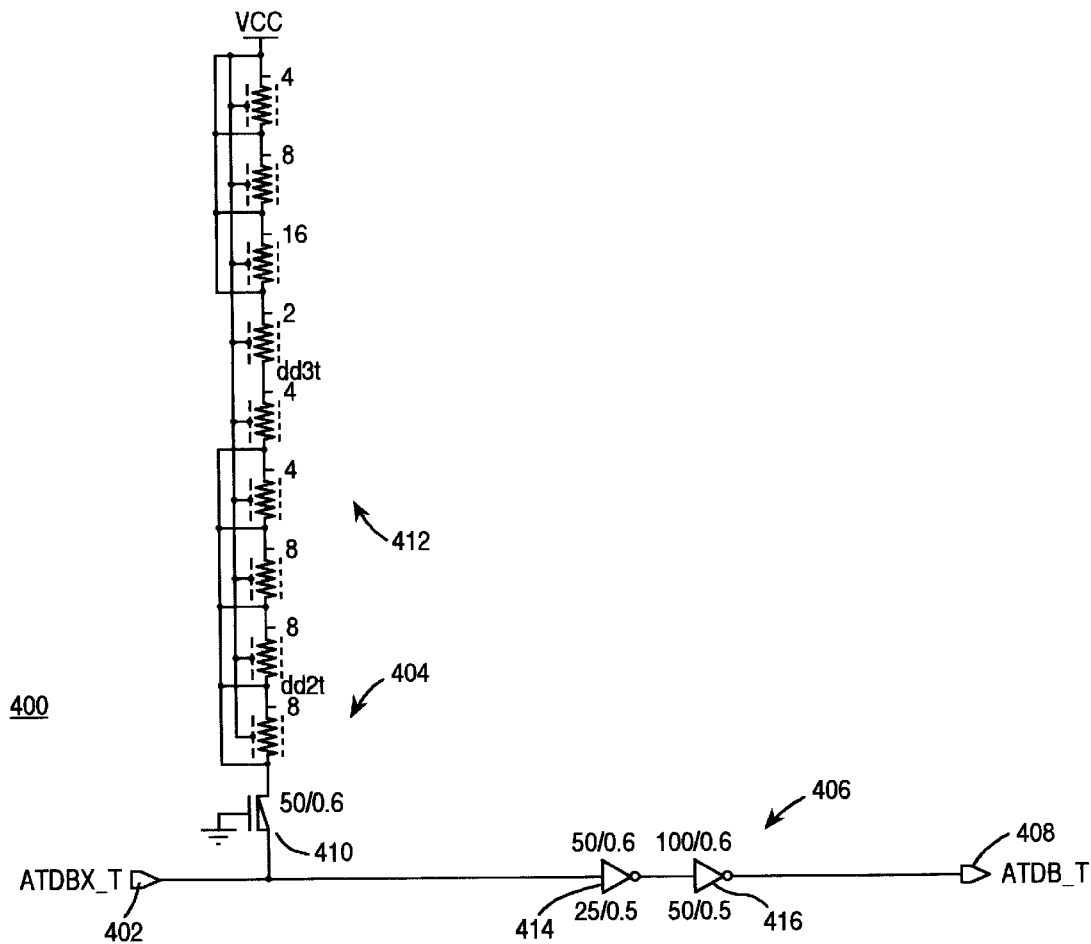
FIG. 4 is a schematic diagram of a first address transition detection buffer circuit for use in the memory integrated circuit of FIG. 1.

FIG. 4 illustrates a schematic diagram of an ATD buffer circuit 400 for use in the memory integrated circuit 100 of FIG. 1. The circuit 400 may be used to provide the function of the address transition detect buffer circuit 144 of FIG. 1. The circuit 400 has an input 402, a pull-up circuit 404, a driver circuit 406 and an output 408.

The input 402 is coupled to the outputs 210 of the local ATD generating circuits located on the top portion 106 of the memory integrated circuit 100 (FIG. 1). As noted above, these outputs 210 are wire ORed together so that any active output may pull the node ATDBX_T to an active low level.

The pull-up circuit 404 operates to bias the node ATDBX_T to a positive voltage. The pull-up circuit 404 includes a p-channel transistor 410 and a plurality of resistors 412. The size and resistance value of the resistors 412 may be chosen to be any suitable value. In the embodiment of FIG. 4, some of the resistors of the plurality of resistors 412 are shorted out to permit subsequent variation in the resistor value. The resistor value, and the relative strength of the P channel transistor 410 are chosen to tailor the rising edge of the voltage on the node ATDBX_T.

The driver circuit 406 in the illustrated embodiment includes a first inverter 414 and a second inverter 416. Any suitable driver circuit may be used to derive the voltage on the output 408 to the appropriate voltage levels with suitable slew rate. That is, the output 408 is coupled to a node label ATDBX_T in FIG. 4 and FIG. 1. This node is a relatively high capacitance node running a long distance across the memory integrated circuit 100. In order to reduce the transition time for the voltage on this node, the driver circuit 406 should be chosen to that substantial current drive to charge and discharge the capacitance associated with this node.

When any address input signal received at the input buffer 120 on the top portion 106 of the memory integrated circuit 100 is changed, the signal at the input 402, labeled ATDBX_T is pulled low by the pull-down driver transistors 262 (FIG. 2). The voltage on this node subsequently gradually goes high by the pull-up circuit 404 in the circuit 400 after all of the pull-down transistors 262 are turned off. The driver circuit 406 buffers the signal on the node ATDBX_T to form the voltage on the node ATDB_T, which goes to the second address transition buffer circuit 150 (FIG. 1) in the bottom or middle portion of the integrated circuit 100.

In order to reduce the delay from input address switching to a rising edge on the ATD signal, large driver devices and wide metal bus lines are used for the signal ATDB_T since this signal travels a long distance from the top to the middle or bottom portion of the integrated circuit 100. Wide metal bus lines are used to increase the conductivity of the lines. Large driver devices are used to provide large current drive to rapidly charge and discharge the highly capacitive lines. An example of a large driver device is the 50 micrometer wide, 0.5 micrometer long driver transistor 260 of FIG. 2.

Figure 5:
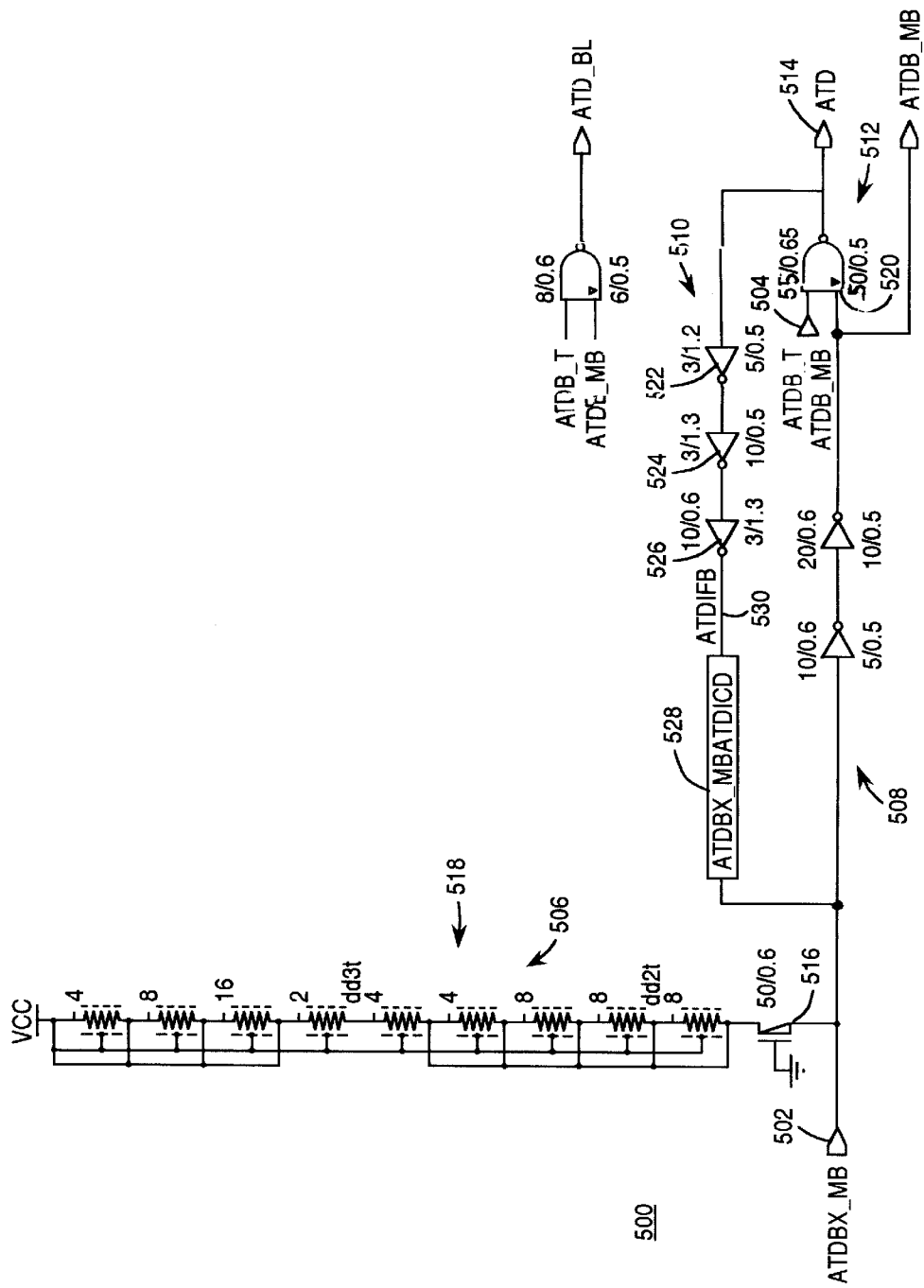
FIG. 5 is a schematic diagram of a second address transition detection buffer circuit, including a feedback circuit, for use in the memory integrated circuit of FIG. 1.

FIG. 5 is a schematic diagram of a second ATD buffer circuit 500 for use in the memory integrated circuit 100 of FIG. 1. The circuit 500 includes a first input 502, a second input 504, a pull-up circuit 506, a driver circuit 508, a feedback circuit 510, an output circuit 512 and an output 514.

The first input 502 is coupled to the node labeled ATDBX_MB. This node is common with the output of the chip enable address transition circuit 300 (FIG. 3) and the address transition generating circuit 200 responsive to the address input A16 (FIG. 2). These address transition generating circuits are located on the middle or bottom portion of the memory integrated circuit 100 (FIG. 1). As noted above, these address transition generating circuits 200, 300 include a pull-down transistor which is active in response to a transition on the chip enable input or the address input A16. The second input 504 is coupled to the node ATDB_T which is produced by the ATD buffer circuit 400 (FIG. 4).

The pull-up circuit 506 includes a p-channel transistor 516 and a plurality of resistors 518. The pull-up circuit 506 is preferably substantially identical to the pull-up circuit 404 of the ATD buffer circuit 400 (FIG. 4). The pull-up circuit 506 biases the node ATDBX_MB to a logic high level except when the chip enable input is changing or the address input A16 is changing. These switches cause a logic zero level on the node ATDBX_MB. After this negative transition, the node ATDBX_MB gradually goes high in response to the pull-up circuit 506, after all of the pull-down transistors in the local ATD generating circuits 200, 300, coupled to the node ATDBX_MB are turned off. The voltage on the node ATDBX_MB is buffered by the driver circuit 508 to generate a signal labeled ATDBX_MB.

The output circuit 512 includes a NAND gate 520. The NAND gate has a first input coupled to the input 504 to receive the signal labeled ATDB_T and a second input coupled to the driver circuit 508 to receive the signal labeled ATDBX_MB. In response to a negative transition on either of these signals, an ATD pulse is generated at the output 514. The output 514 carries the address transition detection signal, labeled ATD in FIG. 5. The ATD signal is provided to a variety of circuits throughout the memory integrated circuit 100 and is used for timing and control purposes. Thus, the NAND gate 520 generates a first portion of an input transition signal, the ATD signal, in response to the first combined signal, ATDBX_T, and the second combined signal, ATDBX_MB. An ATD pulse is generated at the output 514 whenever an address at the top portion 106 is changing or an address, such as A20, or the chip enable signal at the bottom portion 108 is changing.

The feedback circuit 510 includes inverters 522, 524 and 526, along with a driver circuit 528. In the illustrated embodiment, the driver circuit 528 is substantially identical to the chip enable ATD generating circuit 300 of FIG. 3. In this implementation, the output signal from the inverter 526 is provided to the input 302 (FIG. 3). The output 308 of the chip enable ATD generating circuit 300 is coupled to the node ATDBX_MB, and provided to the driver circuit 508. Thus, when the signal ATD at the output 514 goes high the signal ATDIFB at node 530 goes low. Within the circuit 300, this turns on a transistor 324 (FIG. 3). This turns on the open drain pull-down transistor 336 coupled to the node ATDBX_MB.

The second ATD buffer circuit 500 generates a second portion of the input transition signal (the ATD signal) after a predetermined time period has elapsed. Preferably, the delay introduced in the feedback circuit by the inverters 522, 524, 526 is long enough so that the pull-down transistor on ATDBX_MB controlled by ATDIFB, node 530, is the last one being turned off. That is, all other pull-down transistors coupled to the nodes ATDBX_MB and ATDBX_T are turned off before the pull-down transistor within the circuit 528 is turned off. In this manner, the pull-down transistor 336 within the circuit 528 controls the rising edge of the voltage on the node ATDBX_MB and therefore the falling edge on the node ATD at the output 514. In this manner, the ATD pulse widths due to transitions on the chip enable input and address inputs are substantially equalized. In part due to use of the feedback circuit 510, the pulse widths on the ATD signal at the output 514 are made independent of the chip enable transitions and the address input transitions.

Figure 6:
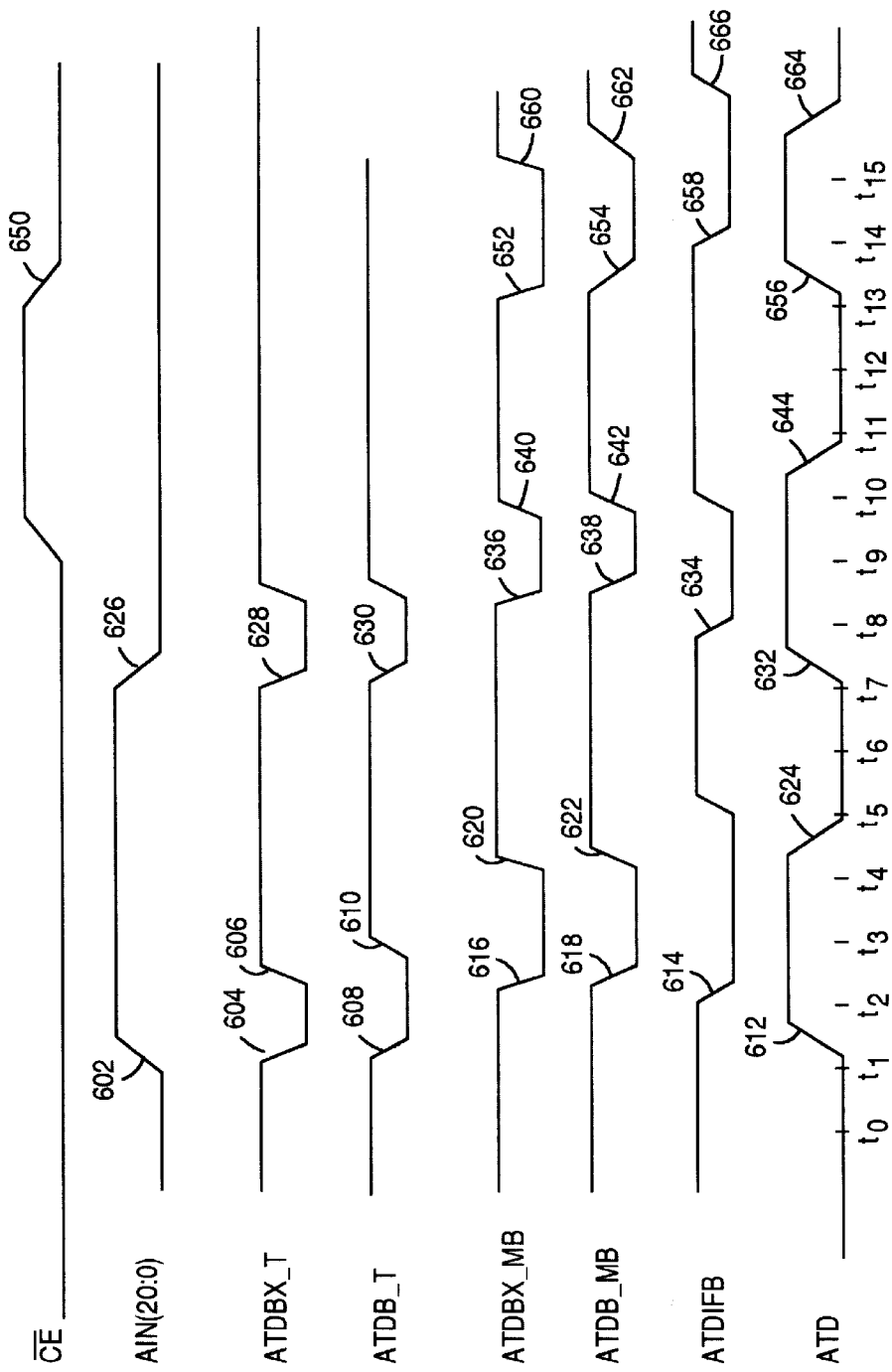
FIG. 6 is a timing diagram illustrating operation of the memory integrated circuit of FIG. 1.

FIG. 6 is a timing diagram illustrating operation of the memory integrated circuit 100 of FIGS. 1–5. Timing begins at time to. At time ti, one of the address input signals, labeled AIn(20:0) changes state. In FIG. 6, the transition is illustrated as a positive going transition 602 at the time $t_1$. However, any transition on any of the address input signals will be adequate to initiate operation of the address transition detection circuitry. In response to the transition 602, the local ATD generating circuit (FIG. 2) associated with the transitioning address bit produces a negative transition 604 on the node labeled ATDBX_T. Subsequently, after the delay operation of the circuit 200, the node ATDBX_T returns to a logic high level after a transition 606 due to the pull-up circuit 404 in the address transition detection buffer circuit 400. This negative pulse on the node ATDBX_T is buffered by the driver circuit 406 to produce signal transitions 608, 610.

The negative transition 608 on the node ATDB_T is received at the input 504 of the ATD buffer circuit 500. The NAND gate 520 inverts the signal and produces a positive transition 612 on the ATD signal at the output 514.

The transition 612 is processed by the feedback circuit 510 to produce the signal ATDIFB at the input to the circuit 528. The signal ATDIFB may be considered to be a reset signal The circuit 528 produces a negative transition 616 on the signal ATDBX_MB, which is buffered by the driver circuit 508 to produce a transition 618 on the signal ATDB_MB. The low level on the signal ATDB_MB keeps the ATD signal at a high level by operation of the NAND gate 520.

After a delay time set by the operation of the circuit 528, the signal ATDBX_MB returns to its high level at a transition 620. This transition 620 is due to the pull up circuit 506 after the pull down transistor at the output of the circuit 528 is turned off. The transition 620 is relatively slow and exhibits the RC time constant associated with the node ATDBX_MB, including the resistance of the resistors 518. The transition 620 is buffered by the driver circuit 508 to produce a transition 622 on the node ATDB_MB. This transition 622 flips the state of the NAND gate 520 and produces the negative transition 624 on the ATD signal, completing an ATD pulse of the ATD signal.

A subsequent transition 626 of any address signal AIn (20:0) at time $t_7$ starts the process again. The transition 626 causes the signal ATDBX_T to be pulled low at a transition 628. This transition is buffered by the driver circuit 406 to produce a transition 630 on the signal ATDB_T.

The transition 630 causes the NAND gate 520 to pull its output to a logic high level at a transition 632 of the ATD signal, starting a subsequent ATD pulse. The transition 632 on the ATD signal is fed back by the feed back circuit 510 to the signal ATDIFB, producing a transition 634. The transition 634 at the input to the circuit 528 causes the circuit 528 to pull the node ATDBX_MB down at transition 636. This transition 636 is buffered to produce transition 638 on the node ATDB_MB.

After a delay time set by the operation of the circuit 528, the signal ATDBX_MB returns to its high level at a transition 640, due to the pull up circuit 506. The transition 640 is buffered by the driver circuit 508 to produce a transition 642 on the node ATDB_MB. This transition 642 flips the state of the NAND gate 520 and produces the negative transition 644 on the ATD signal, completing an ATD pulse of the ATD signal.

At time $t_9$, the chip enable signal goes high. In the illustrated embodiment, no ATD signal is produced. In other embodiments, an ATD signal may be produced to control timing and other operations of the memory.

At time $t_{13}$, a chip enable cycle begins. The chip enable signal goes low, activating the memory, at a transition 650. In response, the circuit 300 pulls the output 308 low in a transition 652 on the signal ATDBX_MB. This transition 652 is buffered by the driver circuit 508 to produce a transition 654 on the signal ATDB_MB. The transition 654 activates the NAND gate 520 to drive the ATD signal high in a transition 656.

The transition 656 is fed back by the feed back circuit 510 to produce a transition 658 on the signal ATDIFB. This transition activates the circuit 528 to keep the node ATDBX_MB at the logic low level with a delay.

After the delay time set by the operation of the circuit 528, the signal ATDBX_MB returns to its high level at a transition 660. This transition 660 is due to the pull up circuit 506 after the circuit 528 has turned off its output device. The transition 660 is buffered by the driver circuit 508 to change the state of the NAND gate 520. This produces a transition 662 on the signal ATDB_MB, which produces at transition 664 on the ATD signal. Subsequently, after the delay time due to the inverters 522, 524, 526, the signal ATDIFB shows a transition 666.

From the foregoing, it can be seen that the present embodiments provide an improved address transition detection circuit which equalizes ATD pulses for use in a memory integrated circuit. The ATD pulses are substantially equal in duration for both negative-going and positive going transitions of the input address signals. Moreover, the ATD pulses are substantially equal in duration for both transitions of the input address signals and transitions of the chip enable signal. Still further, the time delay from the initial address or chip enable transition to the beginning of the ATD pulse is made uniform. The effect is to make overall operation of the memory integrated circuit more uniform and predictable.

While a particular embodiment of the present invention has been shown and described, modifications may be made. It is therefore intended in the appended claims to cover all such changes and modifications which fall within the true spirit and scope of the invention.

What is claimed is:

1. A method for generating an input transition detection signal on a memory integrated circuit, the method comprising:

receiving one or more first input signals;

receiving one or more second input signals;

combining the one or more first input signals to produce a first combined signal;

combining the one or more second input signals to produce a second combined signal;

generating a first portion of the input transition detection signal in response to the first combined signal and the second combined signal; and generating a second portion of the input transition detection signal after a predetermined time period has elapsed.

2. The method of claim 1 wherein generating the first portion comprises:

logically combining the first combined signal and the second combined signal to produce the first portion of the input transition detection signal.

3. The method of claim 1 wherein generating the second portion comprises:

generating a feedback signal having a predetermined delay;

generating the second portion in response to the feedback signal.

4. The method of claim 1 wherein receiving one or more first input signals comprises receiving a plurality of address signals.

5. The method of claim 4 wherein receiving one or more second input signals comprises:

receiving a chip enable signal; and receiving at least one address signal.

6. The method of claim 4 further comprising:

receiving the plurality of address signals at a first end of the memory integrated circuit; and receiving the chip enable signal and the at least one address signal at a second end of the memory integrated circuit.

7. The method of claim 1 further comprising:

generating intermediate address transition detection signals in response to the one or more first input signals;

wire ORing the intermediate address transition detection signals at a common node; and biasing the common node to a predetermined logic level.

8. The method of claim 7 further comprising:

generating an intermediate chip enable signal and at least one intermediate address signal in response to the one or more second input signal;

wire ORing the intermediate chip enable signal and the at least one intermediate address signal at a second common node; and biasing the second common node to a predetermined logic level.

9. The method of claim 8 further comprising:

generating a feedback signal;

wire ORing the feedback signal with the intermediate chip enable signal and the at least one intermediate address signal at the second common node.

10. The method of claim 9 further comprising:

delaying generation of the feedback signal to control the second portion of the input transition detection signal.

11. The method of claim 10 wherein delaying generation of the feedback signal comprises:

delaying generation of the feedback signal so that the feedback signal is the last signal wire ORed forming the second combined signal to be inactivated.

12. A method for generating an input transition detection signal on a memory integrated circuit, the method comprising:

receiving one or more first input signals;

receiving one or more second input signals;

generating a first internal transition detection signal that is a combination of one or more first input signals in response to a transition on any one of the one or more first input signals;

generating a second internal transition detection signal that is a combination of one or more second input signals in response to a transition on any one of the one or more second input signals;

combining the first and second internal detection signals to generate a first signal portion of the input transition detection signal;

generating a reset signal in response to the first signal portion over a predetermined time period; and generating a second signal portion of the input transition detection signal after the predetermined time period has elapsed.

13. The method of claim 12 wherein generating the reset signal comprises:

delaying the first signal portion of the input transition signal by a predetermined amount to produce a delayed signal; and generating the reset signal in response to the delayed signal.

14. A memory integrated circuit comprising:

a first group of address input circuits;

a second group of address input circuits;

a first transition detection circuit coupled to the first group of address input circuits for combining one or more first input signals from the first group of address input circuits to produce a first internal address transition detection signal;

a second transition detection circuit coupled to the second group of address input circuits for combining one or more second input signals from the second group of address input circuits to produce a second internal address transition detection signal; and a logic circuit which combines the first internal address transition detection signal and the second internal address transition detection signal for generating a first portion of an input transition detection signal, and for generating a second portion of the input transition detection signal after a predetermined time period has elapsed.

15. The memory integrated circuit of claim 14 further comprising:

a feedback circuit which resets at least one of the first internal address transition detection signal and second internal address transition detection signal; and wherein the first group of address input circuits is positioned in a first portion of the memory integrated circuit; and the second group of address input circuits is positioned in a second portion of the memory integrated circuit.

16. The memory integrated circuit of claim 15 wherein the logic circuit and the feedback circuit are positioned near the second portion of the memory integrated circuit.

17. The memory integrated circuit of claim 14 wherein the first transition detection circuit comprises a transistor configured to drive the first internal address transition detection signal to an active level; and the second transition detection circuit comprises a transistor configured to drive the second internal address transition detection signal to an active level.

18. The memory integrated circuit of claim 17 further comprising a bias circuit coupled to the first transition detection circuit to return the first internal address transition detection signal to an inactive level.

* * * * *